(12) United States Patent
Kawai et al.

(10) Patent No.: US 11,164,802 B2
(45) Date of Patent: Nov. 2, 2021

(54) WAFER MANUFACTURING METHOD AND MULTILAYER DEVICE CHIP MANUFACTURING METHOD

(71) Applicant: DISCO CORPORATION, Tokyo (JP)

(72) Inventors: Akihito Kawai, Tokyo (JP); Youngsuk Kim, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/878,752

(22) Filed: May 20, 2020

(65) Prior Publication Data
US 2020/0381315 A1  Dec. 3, 2020

(30) Foreign Application Priority Data
May 30, 2019 (JP) .............................. JP2019-100974

(51) Int. Cl.
| | | |
|---|---|---|
| *H01L 21/78* | (2006.01) | |
| *H01L 21/66* | (2006.01) | |
| *H01L 23/544* | (2006.01) | |
| *H01L 25/065* | (2006.01) | |
| *H01L 21/683* | (2006.01) | |
| *H01L 25/00* | (2006.01) | |

(52) U.S. Cl.
CPC .......... *H01L 22/22* (2013.01); *H01L 21/6836* (2013.01); *H01L 21/78* (2013.01); *H01L 23/544* (2013.01); *H01L 25/0657* (2013.01); *H01L 25/50* (2013.01); *H01L 2221/68327* (2013.01); *H01L 2223/5446* (2013.01); *H01L 2225/06541* (2013.01); *H01L 2225/06596* (2013.01)

(58) Field of Classification Search
CPC ... H01L 22/22; H01L 23/544; H01L 25/0657; H01L 21/6836; H01L 25/50; H01L 21/78; H01L 2225/06596; H01L 2221/68327; H01L 2223/5446; H01L 2225/06541; H01L 21/6835; H01L 2221/68322; H01L 22/14; H01L 22/20; H01L 21/50; H01L 21/56
USPC .......................................................... 438/4
See application file for complete search history.

(56) References Cited

U.S. PATENT DOCUMENTS

2015/0001685 A1\* 1/2015 Chung .................... H01L 24/94
  257/621
2017/0186730 A1\* 6/2017 Shen ..................... H01L 21/568

FOREIGN PATENT DOCUMENTS

JP  2012134334 A  7/2012

\* cited by examiner

*Primary Examiner* — Vu A Vu
(74) *Attorney, Agent, or Firm* — Greer, Burns & Crain, Ltd.

(57) ABSTRACT

A wafer manufacturing method includes a wafer preparing step of preparing a wafer partitioned into a plurality of separate areas by a plurality of crossing streets, the wafer including a plurality of semiconductor devices respectively formed in the plural separate areas, a removing step of determining whether each semiconductor device formed in the wafer is an acceptable product or a defective product and removing a defective device area including the semiconductor device determined as the defective product, from the wafer, and a fitting step of fitting a device chip adapted to be fitted into a space formed by the removal of the defective device area from the wafer into the space of the wafer, the device chip including an acceptable semiconductor device having the same function as that of the semiconductor device determined as the defective product.

7 Claims, 9 Drawing Sheets

WAFER MANUFACTURING METHOD AND MULTILAYER DEVICE CHIP MANUFACTURING METHOD

BACKGROUND OF THE INVENTION

Field of the Invention

The present invention relates to a wafer manufacturing method for manufacturing a wafer including a plurality of semiconductor devices and also to a multilayer device chip manufacturing method for manufacturing a multilayer device chip including a plurality of stacked semiconductor devices.

Description of the Related Art

A plurality of crossing streets (division lines) are set on the front side of a wafer to thereby define a plurality of separate areas, and a plurality of semiconductor devices such as integrated circuits (ICs) and large scale integration (LSI) circuits are respectively formed in the plural separate areas of the wafer. This wafer having the plural semiconductor devices is divided along the streets to thereby manufacture a plurality of device chips respectively including the plural semiconductor devices. Further, the plural device chips are packaged to thereby manufacture a package device having a predetermined function. This package device is mounted in various kinds of electronic equipment typified by mobile phones and personal computers.

In recent years, a technique of manufacturing a device chip (multilayer device chip) including a plurality of stacked semiconductor devices has been put into practical use. For example, the multilayer device chip may be obtained by stacking a plurality of device chips and connecting the stacked semiconductor devices through a through electrode (through-silicon via (TSV)) extending through the thickness of each device chip. As compared with the use of wire bonding or the like, the use of such a through electrode has an advantage such that wiring for connecting the semiconductor devices can be reduced in length, so that the multilayer device chip can be reduced in size and the processing speed thereof can be improved. As another method of manufacturing a multilayer device chip, a technique called wafer on wafer (WoW) has also been proposed. In this technique, a plurality of wafers are stacked, and an electrode is formed so as to extend through the stacked wafers and connect the semiconductor devices included in the stacked wafers, thus forming a multilayer wafer. This multilayer wafer is next divided along the streets to manufacture a plurality of multilayer device chips.

There is a case that each wafer for use in manufacturing the multilayer device chips may include a semiconductor device (defective device) as a defective product. When the wafer including this defective device is used, a multilayer device chip including the defective device is manufactured. In the case that any one of the plural semiconductor devices included in the multilayer device chip is a defective product, this multilayer device chip is determined as a defective product (defective chip) in spite of the fact that the other semiconductor devices included in the multilayer device chip are acceptable products. Accordingly, the manufacture of the multilayer device chips is largely affected by a reduction in yield due to such a defective device included in each wafer.

To cope with this problem, each wafer may be tested to determine whether each semiconductor device is an acceptable product or a defective product, before stacking the plural wafers. Then, according to the number of defective devices included in each wafer and the position of each defective device, an optimum combination of the wafers to be used in manufacturing the multilayer device chips may be decided (see JP 2012-134334A, for example). In this case, the number of multilayer device chips including defective devices can be minimized to thereby suppress a reduction in yield.

SUMMARY OF THE INVENTION

As described above, the optimum combination of the wafers is decided according to the result of testing of the wafers. Accordingly, even when each wafer includes a defective device, the number of multilayer device chips (defective chips) including defective devices can be minimized. However, since there is a possibility that each wafer may include a defective device, at least a certain number of defective chips may be manufactured by using these wafers including defective devices. As a result, there is a limit in reducing the number of defective chips.

It is therefore an object of the present invention to provide a wafer manufacturing method which can suppress a reduction in yield of multilayer device chips.

It is another object of the present invention to provide a multilayer device chip manufacturing method using the wafers manufactured by the wafer manufacturing method.

In accordance with an aspect of the present invention, there is provided a wafer manufacturing method including a wafer preparing step of preparing a wafer partitioned into a plurality of separate areas by a plurality of crossing streets, the wafer including a plurality of semiconductor devices respectively formed in the plurality of separate areas, a removing step of determining whether each semiconductor device formed in the wafer is an acceptable product or a defective product and removing a defective device area including the semiconductor device determined as the defective product, from the wafer, and a fitting step of fitting a device chip adapted to be fitted into a space formed by the removal of the defective device area from the wafer into the space of the wafer, the device chip including an acceptable semiconductor device having the same function as that of the semiconductor device determined as the defective product.

In accordance with another aspect of the present invention, there is provided a multilayer device chip manufacturing method including a wafer preparing step of preparing a plurality of wafers each partitioned into a plurality of separate areas by a plurality of crossing streets, each wafer including a plurality of semiconductor devices respectively formed in the plurality of separate areas, a removing step of determining whether each semiconductor device formed in a first one of the wafers is an acceptable product or a defective product and removing a defective device area including the semiconductor device determined as the defective product, from the first wafer, a fitting step of fixing the first wafer to a support wafer and next fitting a device chip adapted to be fitted into a space formed by the removal of the defective device area from the first wafer into the space of the first wafer, the device chip including an acceptable semiconductor device having the same function as that of the semiconductor device determined as the defective product, a resin filling step of filling a gap formed between the first wafer and the device chip fitted in the space with a resin, a thinning step of thinning the first wafer after performing the resin filling step, a wafer stacking step of stacking a second one of the wafers prepared in the wafer preparing step on the first wafer thinned by performing the thinning step, and next performing the removing step, the fitting step, and the resin filling step in series for the second wafer stacked on the first wafer, thereby forming a multilayer wafer including the first wafer and the second wafer stacked on the first wafer, and a dividing step of dividing the multilayer wafer along the streets to thereby form a plurality of multilayer device chips, each multilayer device chip having a multilayer structure such that the semiconductor device obtained from the second wafer is stacked on the semiconductor device obtained from the first wafer.

Preferably, the wafer stacking step further includes the step of stacking the other wafers prepared in the wafer preparing step on the second wafer, each of the other wafers being subjected to the removing step, the fitting step, and the resin filling step in series, whereby the multilayer wafer further includes the other wafers stacked on the second wafer, and each multilayer device chip further has a multi-layer structure such that the semiconductor devices obtained from the other wafers are stacked on the semiconductor device obtained from the second wafer.

As described above, the wafer manufacturing method according to the present invention includes the removing step of removing the defective device area including the semiconductor device (defective device) determined as a defective product, from the wafer and the fitting step of fitting the device chip including the semiconductor device determined as an acceptable product, into the space formed by the removal of the defective device area, in which this semiconductor device determined as the acceptable produce has the same function as that of the semiconductor device determined as the defective product. According to the wafer manufacturing method described above, the wafer excluding the defective device can be manufactured. Further, by stacking the plural wafers manufactured above to form the multilayer wafer and then dividing the multilayer wafer, the multilayer device chip excluding the defective device can be formed. Accordingly, a reduction in yield of the multilayer device chips can be suppressed.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
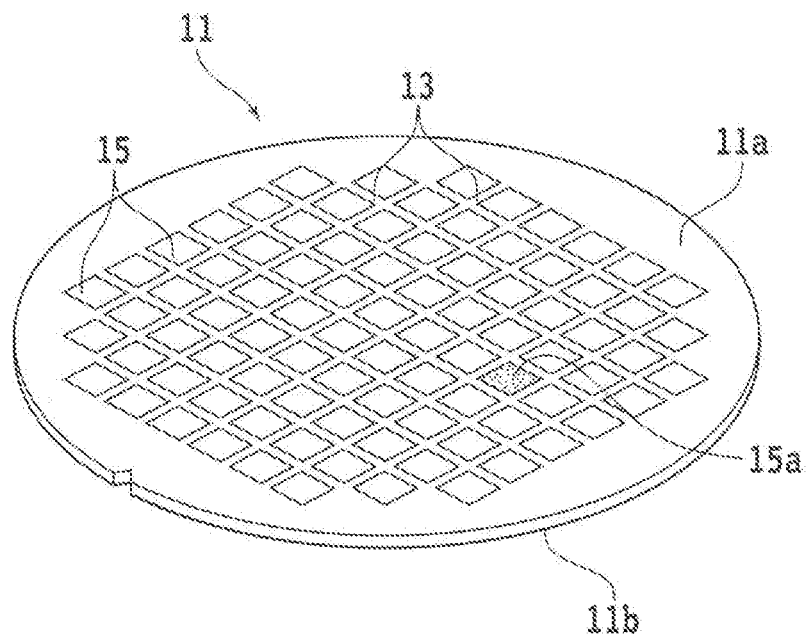
FIG. 1A is a perspective view depicting a wafer.
Figure 1B:
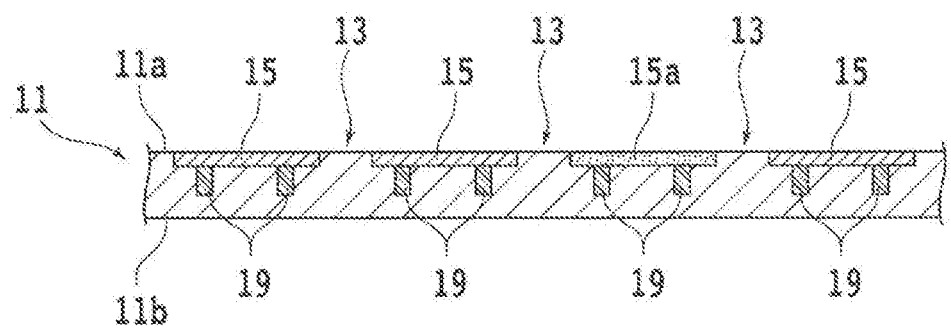
FIG. 1B is a sectional view of the wafer depicted in FIG. 1A.

A preferred embodiment of the present invention will now be described with reference to the attached drawings. First, the configuration of a wafer 11 in the preferred embodiment will be described with reference to FIGS. 1A and 1B. FIG. 1A is a perspective view of the wafer 11, and FIG. 1B is a sectional view of the wafer 11. As depicted in FIGS. 1A and 1B, the wafer 11 is a disk-shaped silicon wafer, for example, and it has a front side 11a and a back side 11b. The wafer 11 is partitioned into a plurality of separate areas by a plurality of crossing streets (division lines) 13 set on the front side 11a of the wafer 11. A plurality of semiconductor devices 15 such as ICs and LSI circuits are respectively formed in the plural separate areas of the wafer 11 on the front side 11a (in the upper surface of the wafer 11 as viewed in FIGS. 1A and 1B). The wafer 11 is not limited in material, shape, structure, size, etc. For example, the wafer 11 may be formed of any semiconductors such as GaAs, InP, GaN, and SiC other than silicon. Further, the wafer 11 may also be formed of any other materials such as glass, ceramic, resin, and metal. Further, the plural semiconductor devices 15 are not limited in kind, number, shape, structure, size, layout, etc.

Figure 1C:
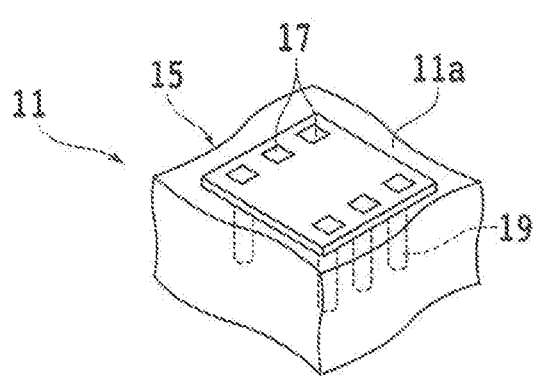
FIG. 1C is an enlarged perspective view depicting a semiconductor device formed in the wafer depicted in FIG. 1A.

FIG. 1C is an enlarged perspective view of each semiconductor device 15. Each semiconductor device 15 has a plurality of electrodes 17 exposed to the front side (upper surface) of each semiconductor device 15, in which the plural electrodes 17 are adapted to be connected to other wiring, electrodes, or semiconductor device. A connection electrode such as a bump may be formed on the front side (upper surface) of each electrode 17. A plurality of electrodes (via electrodes or through electrodes) 19 are embedded in each separate area defined by the streets 13 so as to be connected to each semiconductor device 15. Each electrode 19 is a columnar member extending along the thickness of the wafer 11. For example, the plural electrodes 19 in each separate area are connected to the plural electrodes 17 of each semiconductor device 15, respectively. Each electrode 19 extends from the semiconductor device 15 toward the back side 11b of the wafer 11. That is, the length (height) of each electrode 19 is less than the thickness of the wafer 11. Accordingly, each electrode 19 is not exposed to the back side 11b of the wafer 11, so that each electrode 19 is embedded in the wafer 11. The material of each electrode 19 is not limited. For example, each electrode 19 is formed of metal such as copper, tungsten, and aluminum. Further, an insulating layer for insulating the wafer 11 and each electrode 19 may be formed between the wafer 11 and each electrode 19.

By performing grinding or plasma etching to the back side 11b of the wafer 11 to thereby thin the wafer 11, each electrode 19 is exposed to the back side 11b of the wafer 11. By preparing a plurality of such thin wafers 11 with each electrode 19 exposed to the back side 11b and then stacking the plural thin wafers 11 to form a multilayer wafer, the plural semiconductor devices 15 in the multilayer wafer are stacked with the electrodes 19 interposed between the adjacent semiconductor devices 15, and the adjacent semiconductor devices 15 are connected to each other through the electrodes 19. Thereafter, by performing cutting or laser processing to the multilayer wafer including the plural stacked thin wafers 11, the multilayer wafer is divided along the streets 13. As a result, a plurality of device chips (multilayer device chips) are manufactured, in which each device chip includes the plural stacked semiconductor devices 15.

There is a case that one of the plural semiconductor devices 15 included in the wafer 11 may be a defective product (defective device). FIGS. 1A and 1B depict such a case that the wafer 11 includes a defective device 15a. The defective device 15a corresponds to the semiconductor device 15 not meeting a predetermined standard of electrical characteristics, for example. In the case that a plurality of wafers 11 including the wafer 11 having the defective device 15a are stacked to form a multilayer wafer and that this multilayer wafer is divided, a multilayer device chip including the defective device 15a is manufactured. In this case that one of the plural semiconductor devices 15 included in this multilayer device chip is the defective device 15a, this multilayer device chip is determined as a defective product (defective chip) in spite of the fact that the other semiconductor devices 15 are acceptable products.

To cope with this problem, the wafer manufacturing method according to the preferred embodiment includes the steps of removing the defective device 15a from the wafer 11 to form a space in the wafer 11 and next fitting the acceptable semiconductor device 15 into the space of the wafer 11 as formed by the removal of the defective device 15a. Accordingly, an acceptable wafer 11 excluding the defective device 15a can be manufactured. The wafer manufacturing method according to the preferred embodiment will now be described in more detail.

First, the wafer 11 (see FIG. 1A) having the plural semiconductor devices 15 is prepared, in which the plural semiconductor devices 15 are respectively formed in the plural separate areas defined by the plural crossing streets 13 (wafer preparing step). In this wafer preparing step, a plurality of wafers 11 are preferably prepared because the plural wafers 11 will be stacked to form a multilayer wafer in a subsequent step. The wafer manufacturing method will now be described in the case that one of the plural wafers 11 prepared in the wafer preparing step includes the defective device 15a.

Thereafter, each semiconductor device 15 included in the wafer 11 is tested to determine whether each semiconductor device 15 is an acceptable product or a defective product. In testing each semiconductor device 15, a probe formed of metal is brought into contact with each semiconductor device 15 to measure the electrical characteristics of each semiconductor device 15 (probing). According to whether or not the electrical characteristics measured above meet the predetermined standard, it is determined whether each semiconductor device 15 is an acceptable product or a defective product. In the case that one of the plural semiconductor devices 15 included in the wafer 11 is a defective product (defective device 15a), the semiconductor device 15 is determined as a defective product as the result of testing. Further, the position of the semiconductor device 15 determined as a defective product is recorded.

Figure 2A:
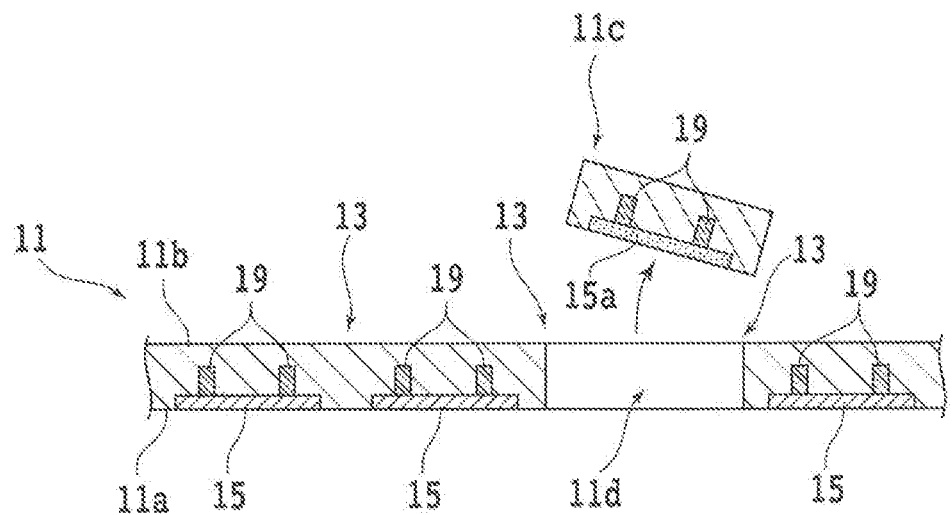
FIG. 2A is a sectional view depicting the wafer in a removing step.

Thereafter, the separate area (defective device area) including the semiconductor device 15 (defective device 15a) determined as a defective product is removed from the wafer 11 (removing step). FIG. 2A is a sectional view depicting the wafer 11 in the removing step.

In the removing step, a support member (not depicted) for supporting the wafer 11 is first prepared, and the wafer 11 is fixed to the support member. For example, the wafer 11 is fixed through a temporary adhesive or a protective tape to the front side of the support member in the condition where the back side 11b of the wafer 11 is opposed to the front side of the support member. For example, the support member may be a disk-shaped wafer formed of the same material as that of the wafer 11 and having substantially the same diameter as that of the wafer 11. Alternatively, the support member may be a dedicated jig or the like for supporting the wafer 11.

Thereafter, the wafer 11 is cut along the four streets 13 surrounding the defective device 15a. Accordingly, a defective device area 11c having a shape like a rectangular prism as including the defective device 15a is cut away to be removed from the wafer 11. A method of cutting the wafer 11 to remove the defective device area 11c is not limited. For example, the wafer 11 may be cut by laser processing or plasma dicing.

In the case of cutting the wafer 11 by laser processing, a laser processing apparatus is used. The laser processing apparatus includes a chuck table (support table) for holding the wafer 11 and a laser applying unit for applying a laser beam toward the wafer 11 held on the chuck table. The wavelength of the laser beam to be applied from the laser applying unit is set such that at least a part of the laser beam is absorbed by the wafer 11, for example. In this case, the laser beam having absorptivity to the wafer 11 is applied from the laser applying unit. By applying this laser beam along the four streets 13 surrounding the defective device 15a, the wafer 11 is subjected to ablation, so that the wafer 11 is cut along the four streets 13. Accordingly, the defective device area 11c is cut away from the wafer 11. The laser beam may be applied to the front side 11a of the wafer 11 or may be applied to the back side 11b of the wafer 11. Further, the conditions for applying the laser beam (e.g., power, spot size, repetition frequency, and number of passes) are suitably set such that the wafer 11 can be cut by applying the laser beam.

There is a case that any layer (functional layer) may be left along each street 13 on the front side 11a of the wafer 11. For example, this functional layer includes various films (conductor films and insulator films) constituting each semiconductor device 15 and a test element group (TEG) for use in evaluating each semiconductor device 15. In this case, this functional layer is preferably removed in advance by applying the laser beam along each street 13 on the front side 11a of the wafer 11.

In the case of using a laser beam having absorptivity to the wafer 11, a method (aqua laser) of spraying a liquid (e.g., pure water) as applying the laser beam may be used, in which the laser beam is applied through a water column to the wafer 11. In this case, processing dust (debris) generated in processing the wafer 11 by using the laser beam can be washed away by the liquid. In particular, before performing a thinning step to be hereinafter described, the aqua laser is preferably used because the wafer 11 is relatively thick before performing the thinning step and the amount of debris generated in processing the thick wafer 11 is therefore large.

The wavelength of the laser beam may be set such that the laser beam has transmissivity to the wafer 11. In this case, the laser beam is focused inside the wafer 11 and scanned along the four streets 13 surrounding the defective device 15a, thereby forming a modified area (modified layer) inside the wafer 11. The area where the modified layer is formed is brittler than the other area of the wafer 11. This modified layer functions as a start point (trigger) of break of the wafer 11, so that the defective device area 11c can be removed by breaking this modified layer. More specifically, when the modified layer is formed inside the wafer 11, cracks are generated from the modified layer so as to extend along the thickness of the wafer 11. Further, when the cracks are connected through the modified layer so as to extend from the front side 11a to the back side 11b of the wafer 11, the defective device area 11c can be easily removed. To facilitate the formation of the cracks extending from the front side 11a to the back side 11b of the wafer 11, two or more modified layers may be formed inside the wafer 11 at different depths. In this case, the number of modified layers may be suitably set according to the thickness or material of the wafer 11.

Further, after forming the modified layer and the cracks inside the wafer 11, wet etching may be performed to remove the defective device area 11c from the wafer 11. The area where the modified layer or the cracks is/are formed can be etched more easily than the other area of the wafer 11. Accordingly, when an etching liquid is supplied to the periphery of the defective device area 11c, etching partially proceeds along the four streets 13 surrounding the defective device 15a, so that the defective device area 11c can be removed from the wafer 11. Further, ultrasonic vibration may be used to remove the defective device area 11c. More specifically, after forming the modified layer inside the wafer 11, the wafer 11 is first immersed in a liquid such as pure water, and ultrasonic vibration is next applied to the liquid. As a result, the defective device area 11c can be removed from the wafer 11 by this ultrasonic vibration transmitted through the liquid to the modified layer in the wafer 11.

In the case of cutting the wafer 11 by plasma dicing, a mask layer is first formed on the front side 11a or the back side 11b of the wafer 11. This mask layer is formed such that the four streets 13 surrounding the defective device 15a are exposed. Thereafter, a plasma etching apparatus is used to supply a plasma gas through the mask layer to the wafer 11. As a result, the wafer 11 is etched to be cut by the plasma gas along the four streets 13 not covered with the mask layer. Accordingly, the defective device area 11c can be removed from the wafer 11. The material of the mask layer is not limited. For example, a resist formed of photosensitive resin may be used as the material of the mask layer. In this case, a water-soluble resin such as polyvinyl chloride (PVA) may be first applied to the wafer 11, and a laser beam may be applied along the four streets 13 surrounding the defective device 15a (ablation). Then, a liquid left along the four streets 13 is removed to thereby form the mask layer.

Figure 2B:
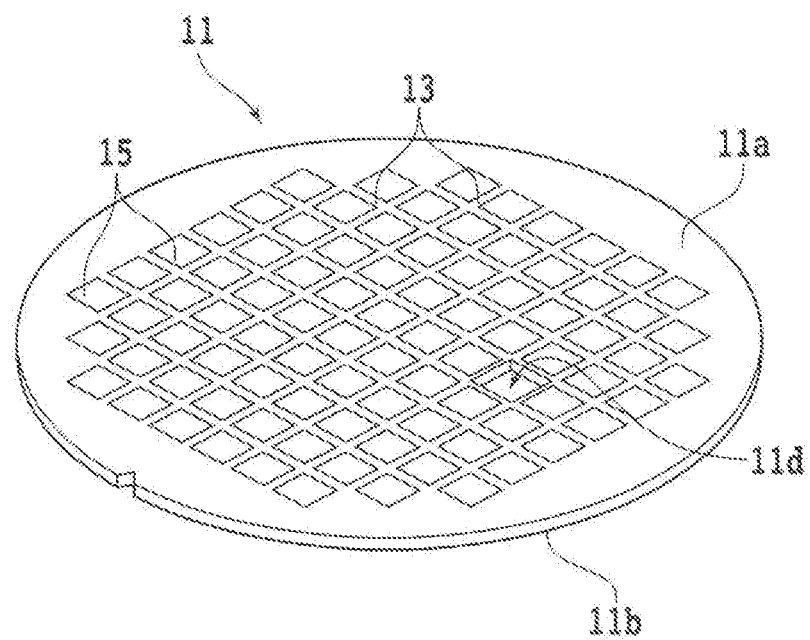
FIG. 2B is a perspective view depicting the wafer in the condition where a defective device area has been removed from the wafer in the removing step.

FIG. 2B is a perspective view depicting the wafer 11 in the condition where the defective device area 11c has been removed. By performing the removing step mentioned above, the defective device area 11c is removed from the wafer 11, so that a rectangular space (vacant area) 11d is formed at the position where the defective device area 11c of the wafer 11 has been present. After finishing the removal of the defective device area 11c, the support member is peeled from the wafer 11.

Figure 3A:
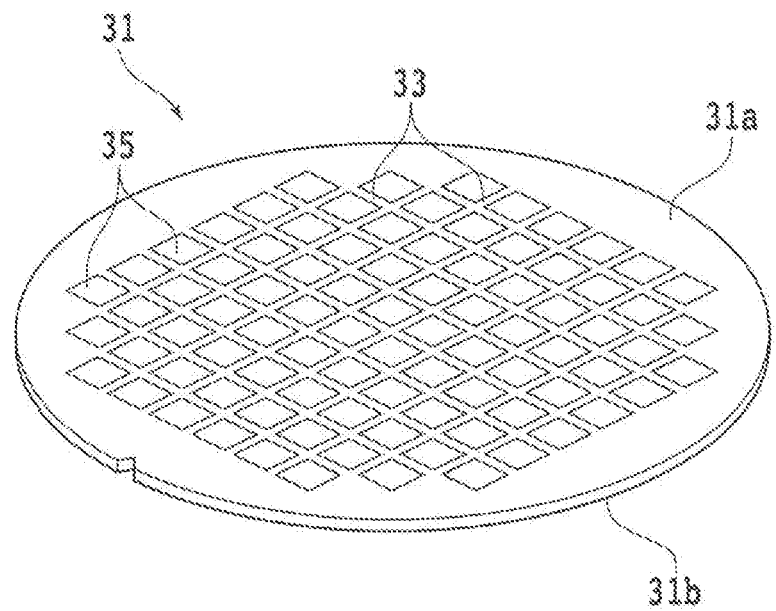
FIG. 3A is a perspective view depicting another wafer for use in preparing a device chip.

Thereafter, a device chip adapted to be fitted into the space 11d of the wafer 11 is prepared. This device chip includes an acceptable semiconductor device 15 of the same kind as that of the defective device 15a. Further, this device chip has a size such that the device chip can be fitted into the space 11d of the wafer 11. That is, this device chip has a size not larger than the size of the space 11d. In preparing this device chip, a wafer 31 having the same structure as that of the wafer 11 is used as depicted in FIG. 3A. FIG. 3A is a perspective view of the wafer 31 for use in preparing the device chip. The wafer 31 is formed of the same material as that of the wafer 11. The wafer 31 has a front side 31a and a back side 31b. The wafer 31 is partitioned into a plurality of separate areas by a plurality of crossing streets (division lines) 33 set on the front side 31a. A plurality of semiconductor devices 35 are respectively formed in the plural separate areas of the wafer 31 on the front side 31a (in the upper surface of the wafer 31 as viewed in FIG. 3A). Each semiconductor device 35 has the same function as that of each semiconductor device 15 depicted in FIG. 1C. Further, the structure of each semiconductor device 35 is similar to that of each semiconductor device 15. A plurality of electrodes (via electrodes or through electrodes) 37 (see FIG. 5B) are connected to each semiconductor device 35. The configuration and material of the electrodes 37 are the same as those of the electrodes 19 connected to each semiconductor device 15 depicted in FIG. 1C.

By dividing the wafer 31 along the streets 33, a plurality of device chips 39 (see FIG. 3B) respectively including the plural semiconductor devices 35 can be manufactured. The wafer 31 may be divided by laser processing or plasma etching as previously described. Alternatively, the wafer 31 may be divided by using a cutting apparatus.

The cutting apparatus includes a chuck table (support table) for holding the wafer 31 and a cutting unit for cutting the wafer 31 held on the chuck table. The cutting unit includes a spindle (rotating shaft) and an annular cutting blade mounted on the spindle for cutting the wafer 31. The cutting blade is fixedly mounted at a front end portion of the spindle. In operation, the spindle is rotated to thereby rotate the cutting blade, and the cutting blade being rotated is lowered to cut the wafer 31. By relatively moving the chuck table and the cutting unit, the wafer 31 can be cut along each street 33 by the cutting blade. In this manner, the wafer 31 can be divided along each street 33 by the cutting apparatus. Accordingly, the plural device chips 39 respectively including the plural semiconductor devices 35 can be obtained from the wafer 31.

Figure 3B:
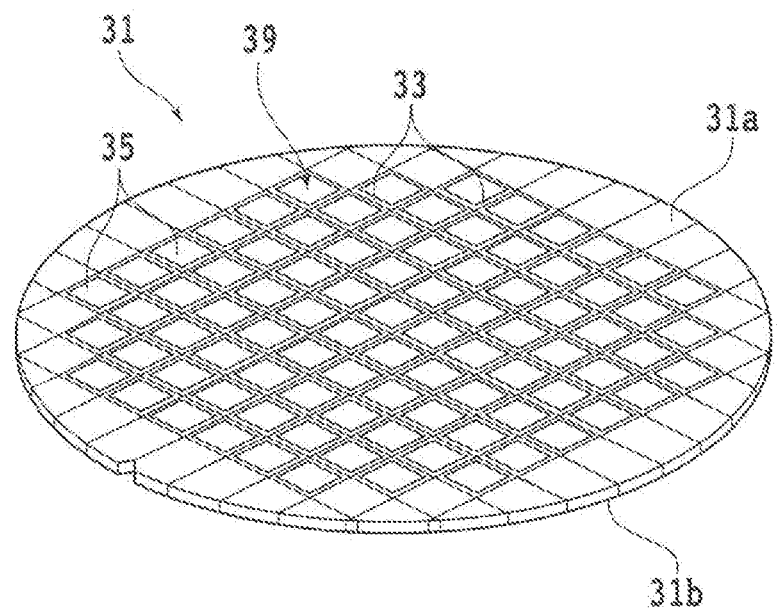
FIG. 3B is a perspective view of the wafer depicted in FIG. 3A in the condition where the wafer has been divided to obtain a plurality of device chips.

FIG. 3B is a perspective view of the wafer 31 in the condition where the wafer 31 has been divided into the plural device chips 39. Each device chip 39 has a size such that each device chip 39 can be fitted into the space 11d (see FIG. 5A) of the wafer 11 in a fitting step to be hereinafter described. For example, the size of each device chip 39 can be adjusted by controlling the width of a target area to be processed in processing the wafer 31 along each street 33.

As another method, in the case that the size of each device chip 39 is previously grasped, the space 11*d* having a size larger than that of each device chip 39 may be formed in the removing step mentioned above.

Each semiconductor device 35 formed in the wafer 31 is similarly tested to determine whether each semiconductor device 35 is an acceptable product or a defective product. Thereafter, the device chip 39 including the semiconductor device 35 determined as a defective product is removed from the plural device chips 39 obtained by dividing the wafer 31. Accordingly, it is possible to obtain the device chip 39 including the acceptable semiconductor device 35 having the same configuration as that of the acceptable semiconductor device 15 (see FIG. 1C). In other words, the device chip 39 to be adopted includes the acceptable semiconductor device 35 having the same function as that of the defective device 15*a* (see FIG. 1A) (i.e., the semiconductor device 35 having the function that must be originally owned by the defective device 15*a*).

The timing of preparing (manufacturing) the device chip 39 is not limited. For example, the device chip 39 may be manufactured before performing the wafer preparing step or simultaneously in performing the wafer preparing step. Further, the device chip 39 may be manufactured at the time between the wafer preparing step and the removing step or after performing the removing step.

Figure 4A:
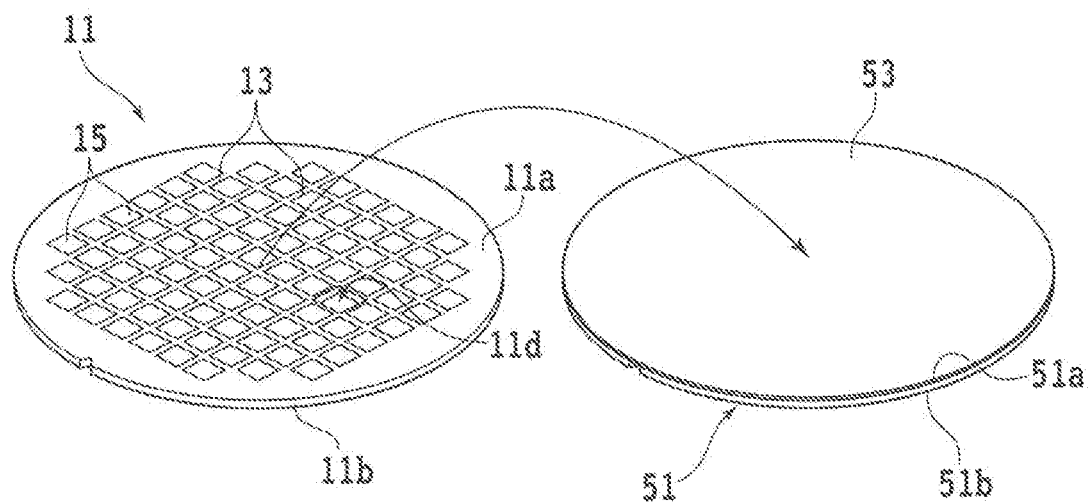
FIG. 4A is a perspective view depicting the wafer depicted in FIG. 2B and a support wafer for supporting the same.

Thereafter, the device chip 39 is fitted into the space 11*d* of the wafer 11 (fitting step). In the fitting step, a support wafer 51 for supporting the wafer 11 is first prepared as depicted in FIG. 4A. FIG. 4A is a perspective view depicting the wafer 11 and the support wafer 51. The support wafer 51 is a disk-shaped wafer having substantially the same diameter as that of the wafer 11. The support wafer 51 has a front side 51*a* and a back side 51*b*. The material of the support wafer 51 is not limited. For example, the support wafer 51 may be formed of the same material as that of the wafer 11.

Figure 4B:
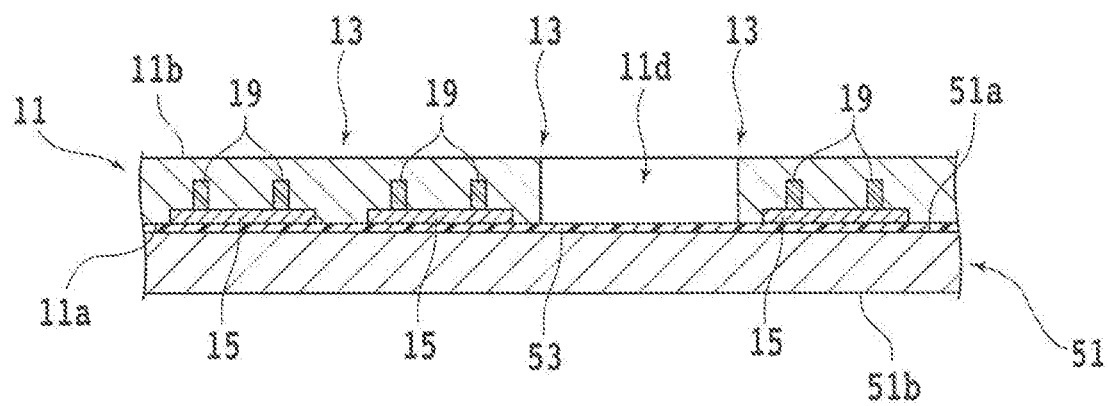
FIG. 4B is a sectional view depicting the wafer fixed to the support wafer depicted in FIG. 4A.

Thereafter, the wafer 11 is attached to the support wafer 51 in such a manner that the front side 11*a* of the wafer 11 is opposed to the front side 51*a* of the support wafer 51 (see FIG. 4A). For example, the wafer 11 is attached through an adhesive layer 53 to the support wafer 51, so that the wafer 11 is fixed to the support wafer 51. The support wafer 51 will be finally peeled from the wafer 11. Accordingly, it is preferable to use a temporary adhesive as the adhesive layer 53, in which this temporary adhesive has adhesion that can be reduced by predetermined treatment (e.g., irradiation with ultraviolet light, heating, or chemical treatment). FIG. 4B is a sectional view of the wafer 11 fixed to the support wafer 51. When the wafer 11 is attached to the support wafer 51 as depicted in FIG. 4B, the lower opening of the space 11*d* of the wafer 11 on the support wafer 51 side (i.e., on the front side 11*a* of the wafer 11) is closed by the support wafer 51 as depicted in FIG. 4B.

Figure 5A:
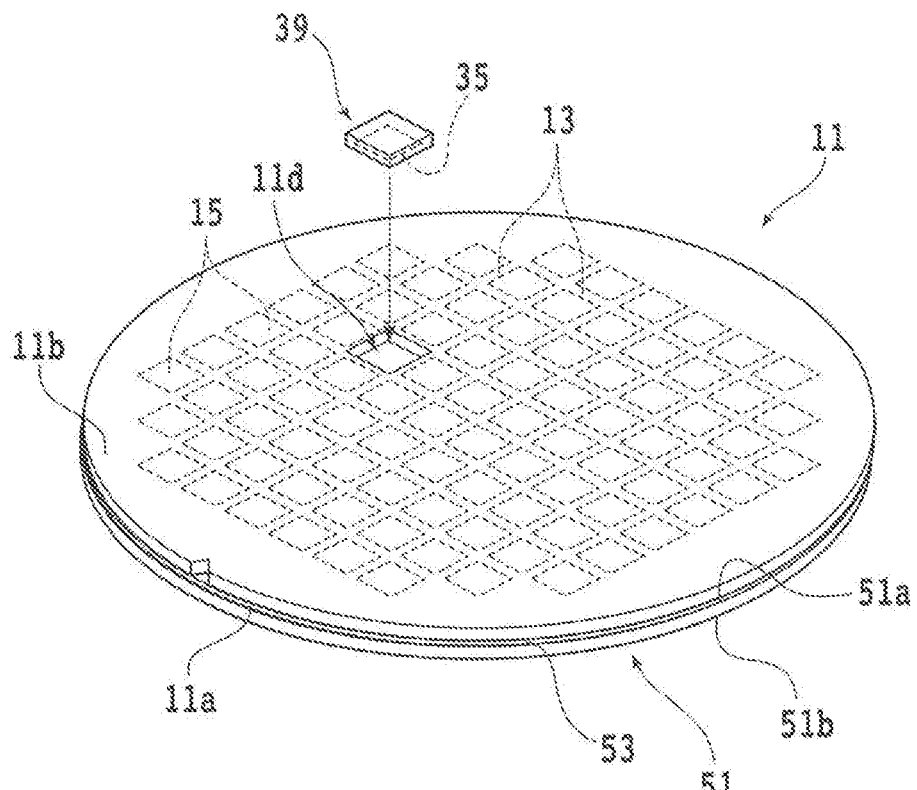
FIG. 5A is a perspective view depicting a manner of fitting the device chip prepared above into a space formed in the removing step.
Figure 5B:
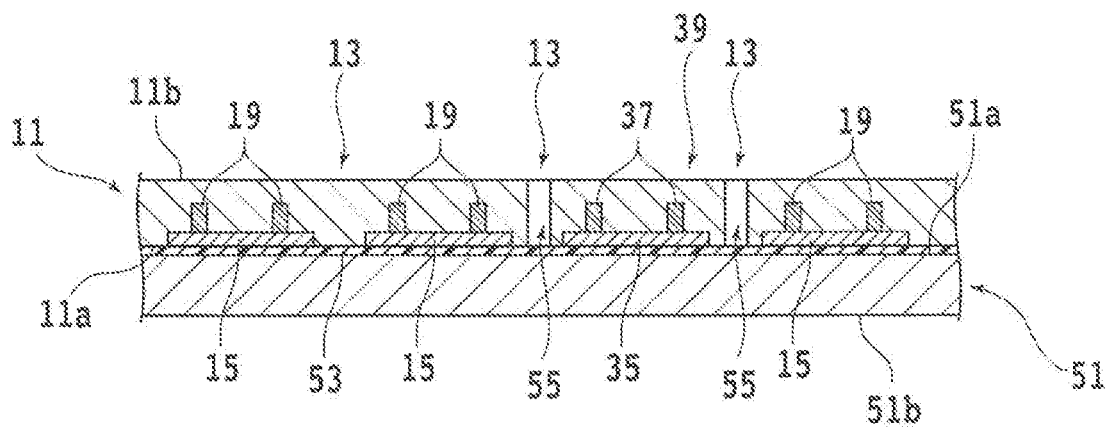
FIG. 5B is a sectional view depicting the wafer in the condition where the device chip has been fitted into the space depicted in FIG. 5A.

Thereafter, the device chip 39 is fitted into the space 11*d* of the wafer 11 supported by the support wafer 51 as depicted in FIG. 5A. FIG. 5A is a perspective view depicting a manner of fitting the device chip 39 into the space 11*d* of the wafer 11. More specifically, the device chip 39 is fitted into the space 11*d* of the wafer 11 in such a manner that the front side of the device chip 39 where the semiconductor device 35 is formed is opposed to the front side 51*a* of the support wafer 51 as depicted in FIG. 5B. FIG. 5B is a sectional view of the wafer 11 in the condition where the device chip 39 has been fitted into the space 11*d* of the wafer 11. In the case that the size of the device chip 39 is smaller than the size of the space 11*d*, that is, the outline of the device chip 39 does not coincide with the outline of the space 11*d*, a rectangular ringlike gap 55 is formed between the side surface of the wafer 11 exposed to the space 11*d* (i.e., the side wall of the space 11*d*) and the side surface of the device chip 39.

The removing step mentioned above may be performed in the condition where the wafer 11 is supported by the support wafer 51. In this case, in the condition where the front side 11*a* of the wafer 11 is attached to the front side 51*a* of the support wafer 51, the defective device area 11*c* is removed from the wafer 11 (see FIG. 2A), and the device chip 39 is next fitted into the space 11*d* of the wafer 11 (see FIG. 5A). Accordingly, the support member for supporting the wafer 11 in the removing step can be eliminated in this case.

Figure 6:
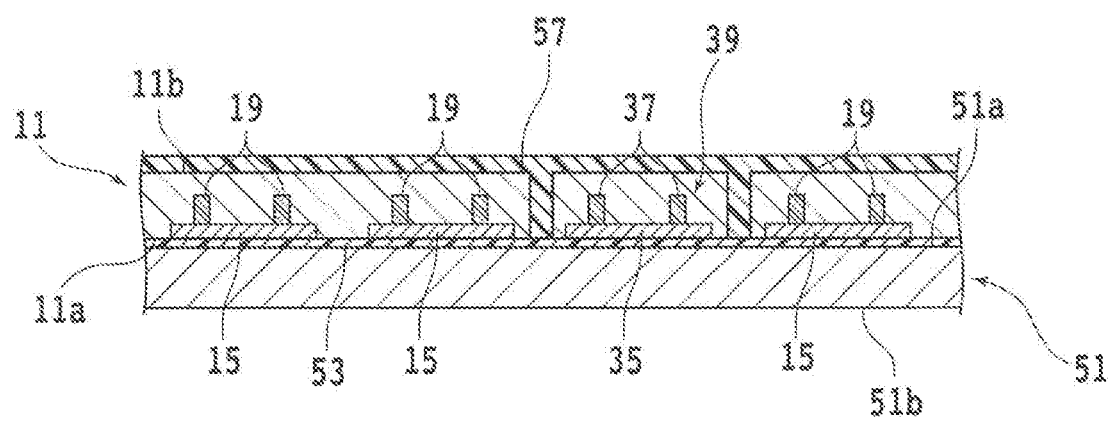
FIG. 6 is a sectional view depicting the wafer in a resin filling step.

Thereafter, the rectangular ringlike gap 55 formed between the wafer 11 and the device chip 39 fitted into the space 11*d* of the wafer 11 is filled with a resin (resin filling step). FIG. 6 is a sectional view depicting the wafer 11 in the resin filling step.

As depicted in FIG. 6, a resin layer 57 is formed on the back side 11*b* of the wafer 11 in the resin filling step. For example, the resin layer 57 is formed by applying a liquid resin such as epoxy resin to the back side 11*b* of the wafer 11 and curing the liquid resin applied. However, the material of the resin layer 57 is not limited. By applying the liquid resin to the back side 11*b* of the wafer 11, a part of the liquid resin flows into the gap 55 (see FIG. 5B) formed between the wafer 11 and the device chip 39, thereby filling the gap 55 with the liquid resin. Thereafter, by curing the liquid resin applied to the back side 11*b* of the wafer 11, the resin layer 57 is formed on the back side 11*b* of the wafer 11 so as to fill the gap 55. Accordingly, the wafer 11 and the device chip 39 are bonded to each other through the resin layer 57, so that the device chip 39 is fixed to the wafer 11.

Thereafter, the back side 11*b* of the wafer 11 with the resin layer 57 is ground to thin the wafer 11 (thinning step). The thinning step may be performed by using a grinding apparatus, for example. The grinding apparatus includes a chuck table (support table) for holding the wafer 11 and a grinding unit for grinding the wafer 11 held on the chuck table. The grinding unit includes a spindle (rotating shaft) and a grinding wheel mounted to the spindle. The grinding wheel has a plurality of abrasive members for grinding the wafer 11.

Figure 7:
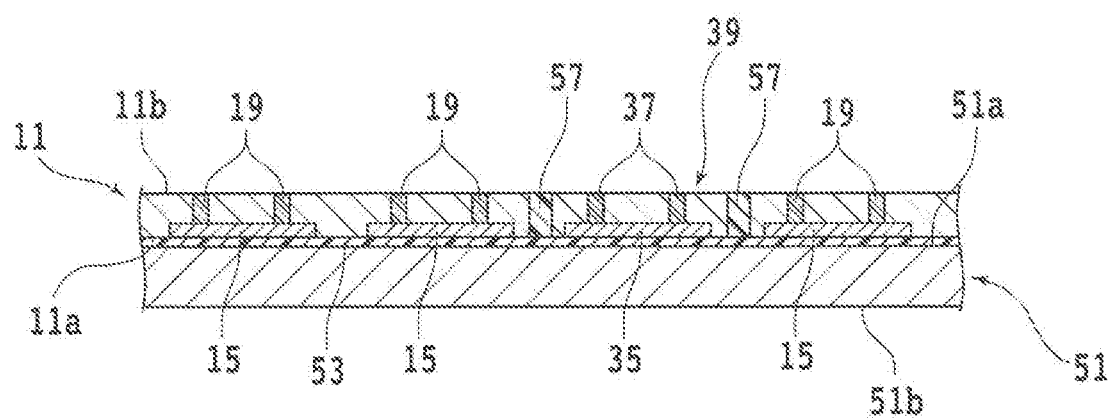
FIG. 7 is a sectional view depicting the wafer in a thinning step.

In operation, the wafer 11 is held on the chuck table in the condition where the back side 11*b* (the resin layer 57) of the wafer 11 is exposed upward. Thereafter, the chuck table is rotated at a predetermined speed, and the grinding wheel is also rotated at a predetermined speed. Thereafter, the abrasive members of the grinding wheel are brought into contact with the resin layer 57 formed on the back side 11*b* of the wafer 11. The grinding wheel is further fed to grind the resin layer 57 and the back side 11*b* of the wafer 11 until the thickness of the wafer 11 is reduced to a predetermined thickness as depicted in FIG. 7. FIG. 7 is a sectional view depicting the wafer 11 in the thinning step. As depicted in FIG. 7, the wafer 11 is thinned until the electrodes 19 connected to each semiconductor device 15 and the electrodes 37 connected to the semiconductor device 35 are exposed to the back side 11*b* of the wafer 11.

As described above, in the case of thinning the wafer 11 after attaching (fixing) the wafer 11 to the support wafer 51, the wafer 11 is attached to the support wafer 51 in the condition where the wafer 11 is thick and therefore has high rigidity. Accordingly, possible deformation of the wafer 11 in attaching the wafer 11 to the support wafer 51 can be suppressed, so that possible damage to the wafer 11 can be prevented. Further, the wafer 11 can be easily positioned with respect to the support wafer 51.

The method of thinning the wafer 11 is not limited to such grinding using the grinding apparatus. For example, plasma etching may be applied to the back side 11b (the resin layer 57) of the wafer 11, thereby thinning the wafer 11. As another method, both the grinding and the plasma etching may be applied to thereby thin the wafer 11.

As described above, by performing the thinning step, the electrodes 19 and 37 are exposed to the back side 11b of the wafer 11. Accordingly, the semiconductor devices 15 and 35 of the wafer 11 can be connected through the electrodes 19 and 37 to other semiconductor devices (not depicted) formed in another wafer adapted to be stacked on the back side 11b of the wafer 11. That is, by using the wafer manufacturing method according to the preferred embodiment, it is possible to manufacture the wafer 11 that can be used for the formation of a multilayer wafer. In the preferred embodiment, the wafer 11 having the embedded electrodes 19 and 37 is thinned to thereby expose the electrodes 19 and 37 to the back side 11b of the wafer 11. As a modification, the electrodes 19 and 37 may be formed after thinning the wafer 11. In this case, after thinning the wafer 11, a plurality of through holes are first formed in the wafer 11 so as to extend from the back side 11b of the wafer 11 to the semiconductor devices 15 and 35. Thereafter, these through holes are filled with a conductive material to thereby form the electrodes 19 and 37 in these through holes.

There will now be described a method of manufacturing a device chip (multilayer device chip) including a plurality of stacked semiconductor devices by using the wafer 11 manufactured above. In manufacturing the multilayer device chip, a multilayer wafer having a plurality of stacked wafers is first formed (wafer stacking step).

In the wafer stacking step, the wafer 11 (see FIG. 7) obtained by performing the thinning step mentioned above and another wafer 61 (see FIG. 8A) prepared in the wafer preparing step mentioned above are used. The wafer 61 has the same configuration as that of the wafer 11 depicted in FIG. 1A. The wafer 61 is formed of the same material as that of the wafer 11. The wafer 61 has a front side 61a and a back side 61b. The wafer 61 is partitioned into a plurality of separate areas by a plurality of crossing streets (division lines) set on the front side 61a. A plurality of semiconductor devices 63 are respectively formed in the plural separate areas of the wafer 61 on the front side 61a (in the lower surface of the wafer 61 as viewed in FIG. 8A). Each semiconductor device 63 has the same configuration and function as those of each semiconductor device 15 depicted in FIG. 1C. A plurality of electrodes (via electrodes or through electrodes) 65 are connected to each semiconductor device 63. The configuration and material of the electrodes 65 connected to each semiconductor device 63 are the same as those of the electrodes 19 connected to each semiconductor device 15 depicted in FIG. 1C.

Figure 8A:
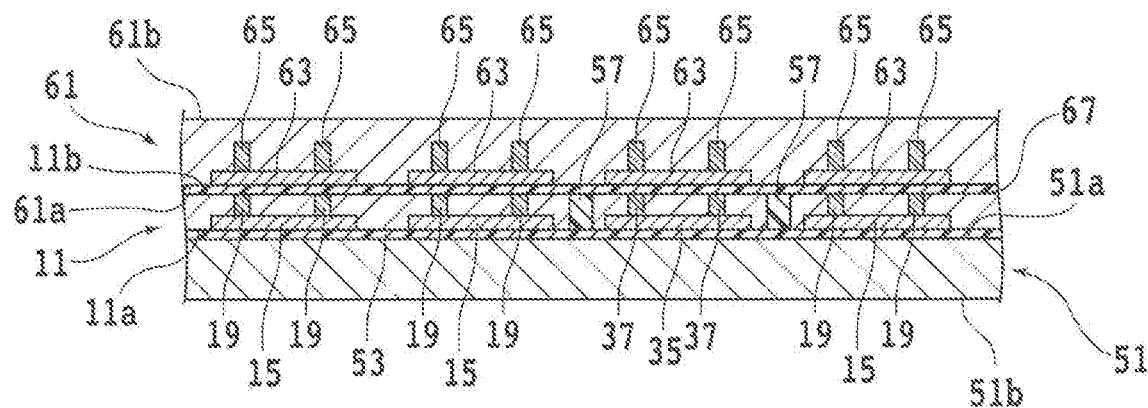
FIG. 8A is a sectional view depicting a plurality of stacked wafers.

In the wafer stacking step, the wafer 61 is first stacked on the wafer 11 as depicted in FIG. 8A. FIG. 8A is a sectional view depicting the wafer 61 stacked on the wafer 11, in which the wafer 11 still remains supported by the support wafer 51. More specifically, the wafer 61 is attached to the wafer 11 in the condition where the front side 61a of the wafer 61 is opposed to the back side 11b of the wafer 11. The wafer 61 is attached through an adhesive layer 67 to the wafer 11 as depicted in FIG. 8A. After bonding the wafer 61 to the wafer 11, the wafer 61 is not separated from the wafer 11. Accordingly, a permanent adhesive is used as the adhesive layer 67. However, the adhesive layer 67 is not always required for the attachment of the wafer 61 to the wafer 11. For example, surface activated bonding may be adopted to bond the back side 11b of the wafer 11 and the front side 61a of the wafer 61.

Before or after attaching the wafer 61 to the wafer 11, the plural semiconductor devices 63 included in the wafer 61 are tested. That is, it is determined whether each semiconductor device 63 is an acceptable product or a defective product. In the case that any one of the plural semiconductor devices 63 included in the wafer 61 is a defective product, the removing step and the fitting step mentioned above are performed for the wafer 61 stacked on the wafer 11. That is, a defective device area including the defective semiconductor device 63 is removed from the wafer 61 in the removing step (see FIG. 2A). Thereafter, the device chip 39 prepared in the device chip preparing step mentioned above is fitted into a space formed by removing the defective device area from the wafer 61 (see FIG. 5A). As a modification, the removing step and the fitting step for the wafer 61 may be performed before stacking the wafer 61 on the wafer 11. After performing the fitting step, the resin filling step mentioned above is performed for the wafer 61.

The wafer 61 is attached to the wafer 11 in such a manner that the semiconductor devices 63 (and 35) included in the wafer 61 are superimposed on the semiconductor devices 15 and 35 included in the wafer 11. In this condition, the semiconductor devices 63 (and 35) included in the wafer 61 are connected to the electrodes 19 and 37 connected to the semiconductor devices 15 and 35 included in the wafer 11. For example, a plurality of bumps (not depicted) are formed as connection electrodes on the front side (the lower surface as viewed in FIG. 8A) of each semiconductor device 63. When the wafer 61 is attached through the adhesive layer 67 to the wafer 11, the bumps are embedded into the adhesive layer 67 and connected to the electrodes 19 and 37. Accordingly, each semiconductor device 63 is connected to the electrodes 19 and 37.

Figure 8B:
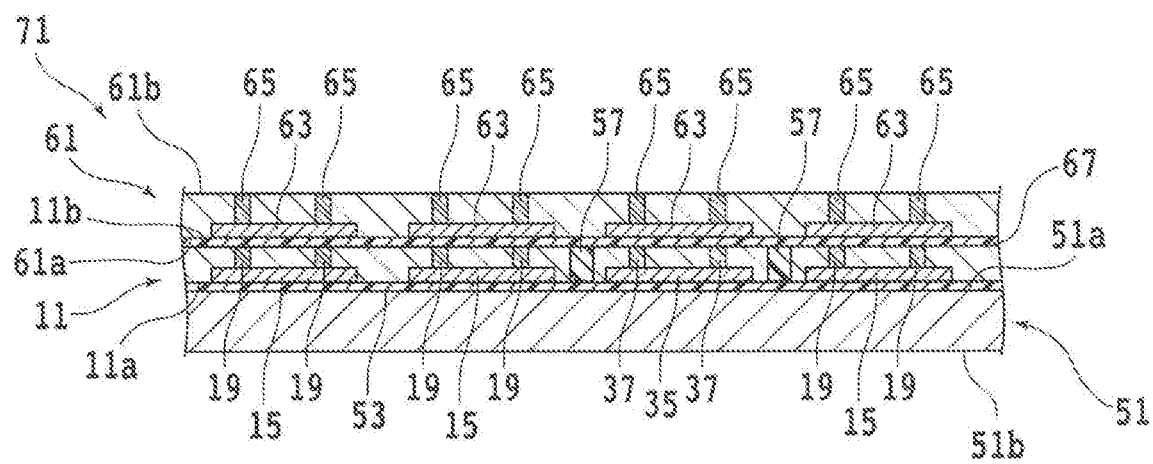
FIG. 8B is a view similar to FIG. 8A, depicting a condition that the uppermost wafer of the stacked wafers has been thinned to form a multilayer wafer.

Thereafter, the thinning step mentioned above is performed for the wafer 61 stacked on the wafer 11. Accordingly, the wafer 61 is thinned until the electrodes 65 connected to each semiconductor device 63 are exposed to the back side 61b of the wafer 61 as depicted in FIG. 8B. FIG. 8B is a sectional view depicting the wafer 11 and the wafer 61 in the condition where the thinning step for the wafer 61 has been finished. In the case that the device chip 39 is fitted in the space formed by removing the defective device area from the wafer 61, the electrodes 37 connected to the semiconductor device 35 included in the device chip 39 are also exposed to the back side 61b of the wafer 61. In this manner, a multilayer wafer 71 including the wafer 11 and the wafer 61 stacked on the wafer 11 can be obtained as depicted in FIG. 8B.

In the wafer stacking step, a plurality of wafers 61 may be stacked on the wafer 11. For example, one or more wafers 61 may be further stacked on the wafer 61 previously stacked on the wafer 11. In this case, each of the plural wafers 61 stacked on the wafer 11 is subjected to the removing step, the fitting step, and the resin filling step. Accordingly, a multilayer wafer 71 including three or more stacked wafers can be obtained. Further, in the preferred embodiment, the stacked semiconductor devices 15 and 63 are connected to each other through the electrodes 19 embedded in the wafer 11, and the stacked semiconductor devices 35 and 63 are connected to each other through the electrodes 37 embedded in the wafer 11. However, the method of connecting the stacked semiconductor devices 15 and 63 and connecting the stacked semiconductor devices 35 and 63 is not limited. For example, after stacking the wafer 61 on the wafer 11, electrodes for connecting the stacked semiconductor devices 15 and 63 may be formed inside the multilayer wafer 71, and electrodes for connecting the stacked semiconductor devices 35 and 63 may be formed inside the multilayer wafer 71.

Thereafter, the multilayer wafer 71 is divided along the streets 13 to thereby form a plurality of multilayer device chips each including the plural stacked semiconductor devices (dividing step). In the dividing step, the multilayer wafer 71 is first supported to a ring frame 75 as depicted in FIG. 9A.

Figure 9A:
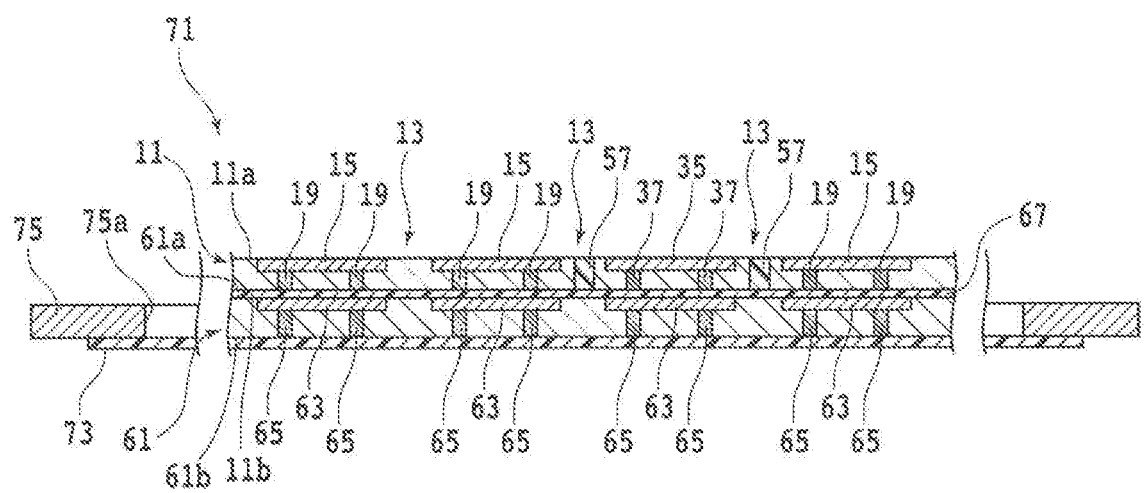
FIG. 9A is a sectional view depicting the multilayer wafer in the condition where it has been supported to a ring frame.

FIG. 9A is a sectional view depicting the multilayer wafer 71 supported to the ring frame 75. As depicted in FIG. 9A, a circular adhesive tape 73 is attached at its central portion to the front side or the back side of the multilayer wafer 71 (to the back side 61b of the wafer 61 as viewed in FIG. 9A). The circular adhesive tape 73 has a diameter larger than that of the multilayer wafer 71. For example, the adhesive tape 73 is a soft adhesive film including a base film and an adhesive layer (stick layer) formed on the base film. The base film is formed of resin such as polyolefin, polyvinyl chloride, and polyethylene terephthalate. The adhesive layer is formed of rubber adhesive or acrylic adhesive. Further, a peripheral portion of the adhesive tape 73 is attached to the ring frame 75. The ring frame 75 has a central circular opening 75a larger in diameter than the multilayer wafer 71. Accordingly, the multilayer wafer 71 is supported through the adhesive tape 73 to the ring frame 75 in the condition where the multilayer wafer 71 is disposed in the central circular opening 75a of the ring frame 75. Thereafter, the support wafer 51 (see FIG. 8B) is peeled from the front side 11a of the wafer 11 of the multilayer wafer 71 supported through the adhesive tape 73 to the ring frame 75. In peeling the support wafer 51, the adhesive layer 53 (see FIG. 8B) may be subjected to predetermined treatment so as to reduce the adhesion of the adhesive layer 53.

Thereafter, the multilayer wafer 71 is divided by using the cutting apparatus mentioned above, for example. In the case of using the cutting apparatus to divide the multilayer wafer 71, the multilayer wafer 71 is first held through the adhesive tape 73 on the chuck table of the cutting apparatus. Thereafter, the cutting blade mounted on the cutting apparatus is operated to cut the multilayer wafer 71 along the streets 13, thereby dividing the multilayer wafer 71. In the case of cutting the multilayer wafer 71 by using the cutting blade, the position of the cutting blade is adjusted such that the lower end of the cutting blade is positioned below the upper surface of the adhesive tape 73 (below the back side 61b of the wafer 61) and above the lower surface of the adhesive tape 73 (above the holding surface of the chuck table). In this condition, the cutting blade is rotated and lowered to fully cut the multilayer wafer 71 along each street 13. Thus, the multilayer wafer 71 is divided along the streets 13 by the cutting apparatus.

Figure 9B:
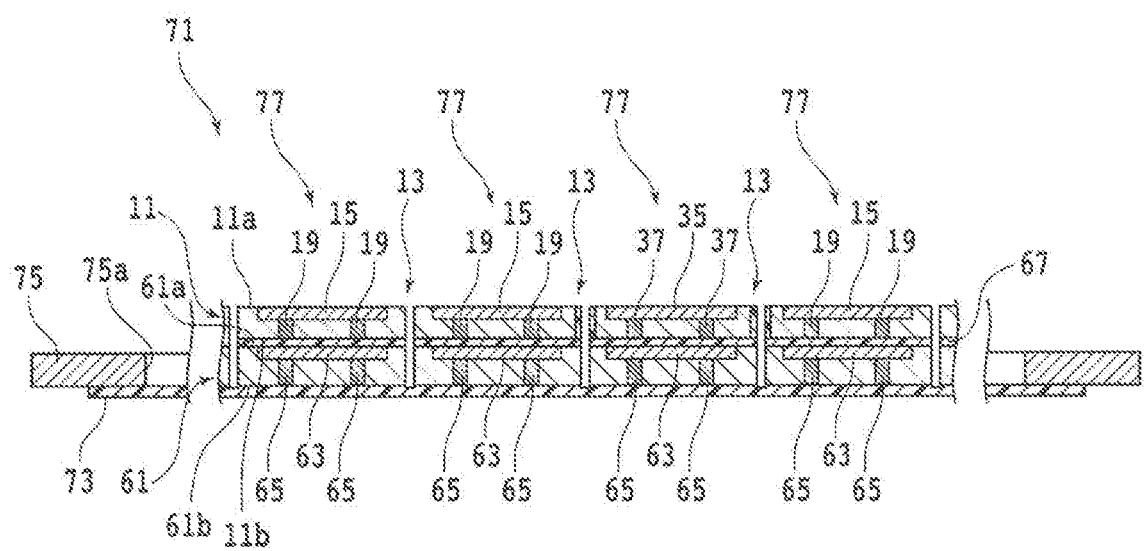
FIG. 9B is a sectional view depicting the multilayer wafer in the condition where it has been divided into a plurality of multilayer device chips.

FIG. 9B is a sectional view of the multilayer wafer 71 divided by using the cutting apparatus as mentioned above. As depicted in FIG. 9B, the multilayer wafer 71 is cut along the streets 13, so that the multilayer wafer 71 is divided into a plurality of multilayer device chips 77 each including the plural stacked semiconductor devices 15 and 63 or including the plural stacked semiconductor devices 35 and 63. In this manner, the plural wafers 11 and 61 are stacked to form the multilayer wafer 71. Then, the multilayer wafer 71 is divided to thereby form the plural multilayer device chips 77.

In the preferred embodiment, the multilayer wafer 71 is divided after peeling the support wafer 51 (see FIG. 8B). As a modification, the multilayer wafer 71 may be divided in the condition where the multilayer wafer 71 remains supported to the support wafer 51. Further, while the multilayer wafer 71 is divided by using the cutting apparatus in the preferred embodiment, the method of dividing the multilayer wafer 71 is not limited. For example, a laser processing apparatus may be used to divide the multilayer wafer 71. In this case, a laser beam is applied to the multilayer wafer 71 along each street 13 to perform ablation, thereby dividing the multilayer wafer 71 into the plural multilayer device chips 77.

As described above, the wafer manufacturing method according to the preferred embodiment includes the removing step of removing the defective device area 11c including the semiconductor device 15 (defective device 15a) determined as a defective product, from the wafer 11 and the fitting step of fitting the device chip 39 including the semiconductor device 35 determined as an acceptable product, into the space 11d formed by the removal of the defective device area 11c, in which the semiconductor device 35 determined as the acceptable product has the same function as that of the semiconductor device 15 determined as the defective product. According to the wafer manufacturing method described above, the wafer 11 excluding the defective device 15a can be manufactured. Further, by stacking the plural wafers 11 and 61 manufactured above to form the multilayer wafer 71 and then dividing the multilayer wafer 71, the multilayer device chip 77 excluding the defective device 15a can be formed. Accordingly, a reduction in yield of the multilayer device chips 77 can be suppressed.

The structure and method according to the above preferred embodiment may be suitably modified without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer manufacturing method comprising:
    a wafer preparing step of preparing a wafer partitioned into a plurality of separate areas by a plurality of crossing streets, the wafer including a plurality of semiconductor devices respectively formed in the plurality of separate areas, each of said semiconductor devices including a plurality of electrodes exposed on a front side of said plurality of said semiconductor devices and a plurality of through electrodes, each of said through electrodes associated with one of said plurality of said electrodes;
    a removing step of determining whether each semiconductor device formed in the wafer is an acceptable product or a defective product and removing a defective device area including the semiconductor device determined as the defective product, from the wafer; and
    a fitting step of fitting a device chip adapted to be fitted into a space formed by the removal of the defective device area from the wafer into the space of the wafer, the device chip including an acceptable semiconductor device having the same function as that of the semiconductor device determined as the defective product.

2. The wafer manufacturing method according to claim 1, wherein said electrodes and said through electrodes are positioned on opposing sides of each of said semiconductor areas.

3. The wafer manufacturing method according to claim 1, wherein ends of said through electrodes are spaced from a back side of said semiconductor devices.

4. A multilayer device chip manufacturing method comprising:

a wafer preparing step of preparing a plurality of wafers each partitioned into a plurality of separate areas by a plurality of crossing streets, each wafer including a plurality of semiconductor devices respectively formed in the plurality of separate areas, each of said semiconductor devices including a plurality of electrodes exposed on a front side of said semiconductor devices and a plurality of through electrodes, each of said through electrodes associated with one of said plurality of said electrodes;

a removing step of determining whether each semiconductor device formed in a first one of the wafers is an acceptable product or a defective product and removing a defective device area including the semiconductor device determined as the defective product, from the first wafer;

a fitting step of fixing the first wafer to a support wafer and next fitting a device chip adapted to be fitted into a space formed by the removal of the defective device area from the first wafer into the space of the first wafer, the device chip including an acceptable semiconductor device having the same function as that of the semiconductor device determined as the defective product;

a resin filling step of filling a gap formed between the first wafer and the device chip fitted in the space with a resin;

a thinning step of thinning the first wafer after performing the resin filling step;

a wafer stacking step of stacking a second one of the wafers prepared in the wafer preparing step on the first wafer thinned by performing the thinning step, and next performing the removing step, the fitting step, and the resin filling step in series for the second wafer stacked on the first wafer, thereby forming a multilayer wafer including the first wafer and the second wafer stacked on the first wafer; and a dividing step of dividing the multilayer wafer along the streets to thereby form a plurality of multilayer device chips, each multilayer device chip having a multilayer structure such that the semiconductor device obtained from the second wafer is stacked on the semiconductor device obtained from the first wafer.

5. The multilayer device chip manufacturing method according to claim 4, wherein the wafer stacking step further includes a step of stacking the other wafers prepared in the wafer preparing step on the second wafer, each of the other wafers being subjected to the removing step, the fitting step, and the resin filling step in series, whereby the multilayer wafer further includes the other wafers stacked on the second wafer, and each multilayer device chip further has a multilayer structure such that the semiconductor devices obtained from the other wafers are stacked on the semiconductor device obtained from the second wafer.

6. The wafer manufacturing method according to claim 4, wherein said electrodes and said through electrodes are positioned on opposing sides of each of said semiconductor areas.

7. The wafer manufacturing method according to claim 4, wherein ends of said through electrodes are spaced from a back side of said semiconductor devices.

* * * * *